United States Patent
Lee et al.

(10) Patent No.: US 7,463,476 B2
(45) Date of Patent: Dec. 9, 2008

(54) CAPACITOR WITH NANOTUBES AND METHOD FOR FABRICATING THE SAME

(75) Inventors: Eun-A Lee, Kyoungki-do (KR); Ho-Jin Cho, Kyoungki-do (KR); Young-Dae Kim, Kyoungki-do (KR); Jun-Soo Chang, Kyoungki-do (KR); Su-Jin Chae, Kyoungki-do (KR); Hai-Won Kim, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 268 days.

(21) Appl. No.: 11/148,057

(22) Filed: Jun. 7, 2005

(65) Prior Publication Data
US 2006/0221548 A1 Oct. 5, 2006

(30) Foreign Application Priority Data
Mar. 31, 2005 (KR) .................... 10-2005-0027337

(51) Int. Cl.
*H01G 4/06* (2006.01)
(52) U.S. Cl. .............. 361/321.1; 361/321.2; 361/301.1; 361/311; 361/313; 361/306.1; 438/455; 438/459; 438/736; 438/738
(58) Field of Classification Search .............. 361/321.1, 361/321.2, 311–313, 306.1, 306.2, 306.3, 361/302–305, 301.1, 301.2; 438/455, 459, 438/736, 738
See application file for complete search history.

(56) References Cited

U.S. PATENT DOCUMENTS

| | | | | |
|---|---|---|---|---|
| 5,311,055 | A | * | 5/1994 | Goodman et al. ........... 257/593 |
| 6,159,789 | A | * | 12/2000 | Chuang et al. .............. 438/253 |
| 6,518,194 | B2 | * | 2/2003 | Winningham et al. ....... 438/717 |
| 6,628,053 | B1 | * | 9/2003 | Den et al. .................... 313/310 |
| 6,706,402 | B2 | * | 3/2004 | Rueckes et al. ............. 428/408 |
| 6,934,144 | B2 | * | 8/2005 | Ooma et al. ................. 361/303 |
| 6,998,634 | B2 | * | 2/2006 | Cheong et al. ................. 257/9 |
| 7,112,525 | B1 | * | 9/2006 | Bhansali et al. ............. 438/618 |
| 2002/0160111 | A1 | * | 10/2002 | Sun et al. ................. 427/248.1 |

FOREIGN PATENT DOCUMENTS

| | | |
|---|---|---|
| JP | 11-297089 | 10/1999 |
| KR | 100200764 | 3/1999 |
| KR | 2001-0001583 | 1/2001 |
| KR | 1019970068362 | 3/2005 |

* cited by examiner

*Primary Examiner*—Nguyen T Ha
(74) *Attorney, Agent, or Firm*—Blakely, Sokoloff, Taylor & Zafman (57) ABSTRACT

A capacitor with nanotubes and a method for fabricating the same are provided. The capacitor includes: a lower electrode including a patterned conductive layer and a plurality of nanotubes formed on the patterned conductive layer in the shape of whiskers without using a catalytic layer; a dielectric layer formed on the lower electrode; and an upper electrode formed on the dielectric layer. The method includes the steps of: forming a conductive layer for forming a lower electrode; forming a nanotube array including a plurality of nanotubes formed on the conductive layer without using a catalytic layer; forming a dielectric layer on the nanotube array; and forming an upper electrode on the dielectric layer.

13 Claims, 6 Drawing Sheets

CAPACITOR WITH NANOTUBES AND METHOD FOR FABRICATING THE SAME

FIELD OF THE INVENTION

The present invention relates to a semiconductor technology; and, more particularly, to a capacitor with nanotubes and a method for fabricating the same.

DESCRIPTION OF RELATED ART

As dynamic random access memory (DRAM) devices have been highly integrated, the size of a unit cell has been decreased. This decrease in the cell size has also resulted in a decrease in the size of a capacitor. However, this decreased capacitor size makes it difficult to secure a sufficient capacitance.

In a typical capacitor that uses a structure of nitride and oxide (NO) as a dielectric layer, those dielectric materials with a higher dielectric constant than that of the NO structure are used to secure a sufficient level of the capacitance. Examples of such dielectric materials are tantalum oxide ($Ta_2O_5$), barium strontium titanate (BST) and lead zirconate titanate (PZT). Another method of securing the capacitance is to increase the area of the capacitor by using metastable polysilicon (MPS). However, the use of the high dielectric materials or the MPS is still limited to secure a required capacitance level.

Currently, as a method of securing the capacitance per unit cell required for DRAM devices with more than several tens of gigabytes, the published Korean patent application no. 2004-0069492, disclosed by Choel-Sung Hwang on Aug. 6, 2004, entitled "Semiconductor Device Having Capacitor Formed Using Nano Structures and Method for Manufacturing the Same" suggests a capacitor fabrication method using nanotubes.

Figure 1:
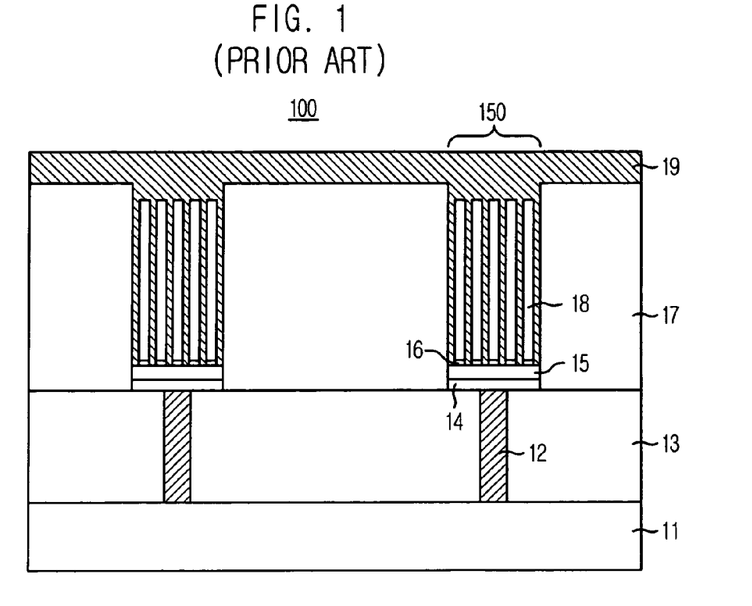
FIG. 1 is a cross-sectional view showing a conventional capacitor with nanotubes.

FIG. 1 is a cross-sectional view showing a conventional capacitor using nanotubes.

As shown, a capacitor 100 is formed on a semi-finished substrate 11 on which a first insulation layer 13 including a contact 12 is formed. Although not illustrated, other various device elements such as transistors are formed on the substrate 11. On the first insulation layer 13, a second insulation layer 17 in which lower electrode regions 150 for forming the capacitor 100 is formed. A reference numeral 19 denotes an upper electrode 19 including a dielectric layer (hereinafter referred to as the dielectric and upper electrode layer).

More specifically, the capacitor 100 includes: a patterned diffusion barrier layer 14 contacting the contact 12 penetrating into the first insulation layer 13; a patterned anti-reaction layer 15 formed on the patterned diffusion barrier layer 14; a catalytic layer 16 formed on the patterned anti-reaction layer 15; a nanotube array 18 including a plurality of conductive nanotubes each formed in perpendicular to the catalytic layer 16; and the dielectric and upper electrode layer 19 formed on the nanotube array 18. Herein, the patterned diffusion barrier layer 14, the patterned anti-reaction layer 15 and the nanotube array 18 are formed in each of the lower electrode regions 150 defined within the second insulation layer 17. The catalytic layer 16 serves a role in growing the conductive nanotubes and includes a transition metal such as nickel (Ni), iron (Fe), cobalt (Co) or an alloy thereof.

Each of the conductive nanotubes of the nanotube array 18 serving as a lower electrode of the capacitor 100 has a diameter ranging from about 5 nm to about 15 nm and a height ranging from about 0.8 μm to about 1.3 μm. Also, the individual nanotube includes carbon (C), silicon (Si), an alloy of silicon and germanium (Si—Ge) or zinc oxide (ZnO). However, the catalytic layer 16 is essential to form the nanotubes of the nanotube array 18, and thus, the capacitor fabrication process may become complicated.

SUMMARY OF THE INVENTION

It is, therefore, an object of the present invention to provide a capacitor with nanotubes formed without a catalytic layer and a higher level of charge capacitance than the charge capacitance of a capacitor formed by using metastable polysilicon and a method for fabricating the same.

In accordance with an aspect of the present invention, there is provided a capacitor, including: a lower electrode including a patterned conductive layer and a plurality of nanotubes formed on the patterned conductive layer without using a catalytic layer; a dielectric layer formed on the lower electrode; and an upper electrode formed on the dielectric layer.

In accordance with another aspect of the present invention, there is provided a method for fabricating a capacitor, including the steps of: forming a conductive layer for forming a lower electrode; forming a nanotube array including a plurality of nanotubes formed on the conductive layer without using a catalytic layer; forming a dielectric layer on the nanotube array; and forming an upper electrode on the dielectric layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A capacitor with nanotubes and a method for fabricating the same in accordance with a preferred embodiment of the present invention will be described in detail with reference to the accompanying drawings.

Figure 2:
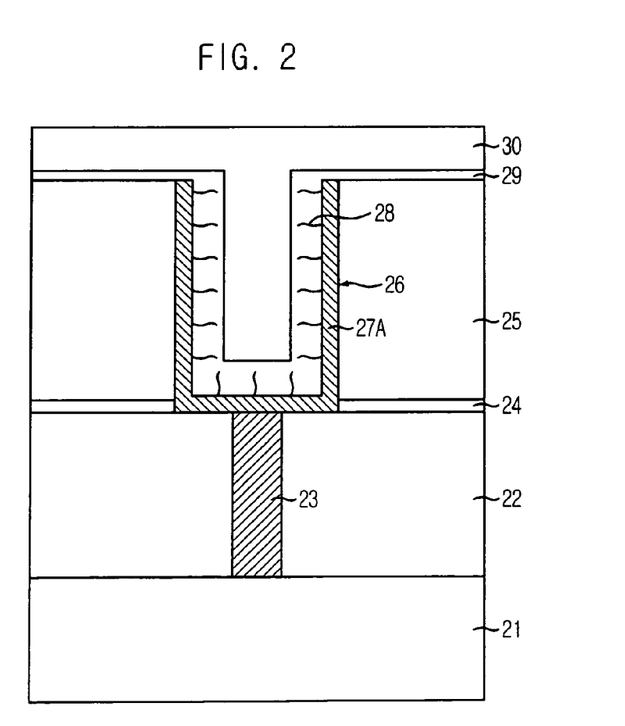
FIG. 2 is a cross-sectional view showing a capacitor structure in accordance with a preferred embodiment of the present invention.

FIG. 2 is a cross-sectional view showing a capacitor structure in accordance with a preferred embodiment of the present invention.

As shown, the capacitor includes: a lower electrode including a patterned conductive layer 27A and a plurality of nanotubes 28 grown on the patterned conductive layer 27A in the form of whiskers without using a catalytic layer; a dielectric layer 29 formed on the lower electrode; and an upper electrode 30 formed on the dielectric layer 29.

The lower electrode including the patterned conductive layer 27A and the nanotubes 28 is formed inside of an opening 26 of a second insulation layer 25. In more detail, a first insulation layer 22 including a contact plug 23 is formed on a substrate 21, and the second insulation layer 25 including the cylinder-shaped opening 26 is formed on the first insulation layer 22. The cylinder-shaped opening 26 exposes the contact plug 23, which is electrically connected with the patterned conductive layer 27A. Also, an etch barrier layer 24 is formed between the first insulation layer 22 and the second insulation layer 25.

In FIG. 2, the patterned conductive layer 27A is formed in a single layer of an impurity doped polysilicon or impurity undoped polysilicon layer or in stacked layers of an impurity doped polysiliocn layer and an impurity undoped polysilicon layer. For the impurity doped polysilicon layer, phosphorus (P) or arsenic (As) is used, and a doping concentration of the selected impurity ranges from approximately $1 \times 10^{20}$ atoms/cm$^3$ to approximately $5 \times 10^{21}$ atoms/cm$^3$.

The nanotubes 28 are formed by employing a chemical vapor deposition (CVD) method under a mechanism of forming metastable polysilicon. Especially, in the case that the nanotubes 28 are formed of silicon, a source gas is one of $SiH_4$ and $CH_3SiCl_3$. In the case that the nanotubes 28 are formed of carbon, a source gas uses a carbon-based gas selected from a group consisting of $C_2H_2$, $C_2H_4$, $CH_4$ and CO. In the case that the nanotubes 28 are formed in silicon-carbon nanotubes where silicon and carbon are mixed, a silicon-based gas selected from $SiH_4$ and $CH_3SiCl_3$ and a carbon-based gas selected from $C_2H_2$, $C_2H_4$, $CH_4$ and CO are mixed in a predetermined ratio. Also, $H_2$ gas and He gas are used as a carrier gas and a dilution gas, respectively.

As mentioned above, the nanotubes 28 are formed through the CVD method without employing a catalytic layer, for instance, a metal layer. The formation of the nanotubes 28 will be described in detail in the foregoing explanation.

FIGS. 3A to 3E are cross-sectional views illustrating a method for fabricating the capacitor shown in FIG. 2 in accordance with the preferred embodiment of the present invention.

Figure 3A:
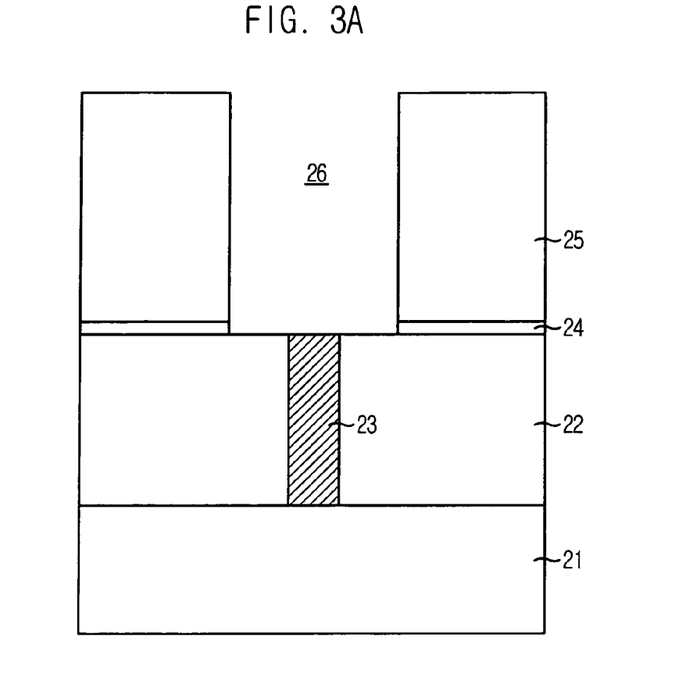
FIGS. 3A to 3E are cross-sectional views illustrating a method for fabricating a capacitor in accordance with the preferred embodiment of the present invention.

Referring to FIG. 3A, the first insulation layer 22 is formed on the substrate 21. Although not illustrated, the first insulation layer 22 is etched to form a contact hole for use in a storage node, which is, in turn, filled with a contact plug material such as polysiliocn. Then, an etch-back process or a chemical mechanical polishing (CMP) process is performed on the plug material, i.e., the polysilicon layer formed on the first insulation layer 22 until the polysiliocn layer fills the contact hole, thereby forming the contact plug 23 for use in a storage node. Also, although not illustrated, prior to forming the first insulation layer 22, a transistor formation process and a bit line formation process are performed; thus, the first insulation layer 22 is an inter-layer insulation layer formed in a multi-layer structure.

Next, the etch barrier layer 24 and the second insulation layer 25 are sequentially formed on the first insulation layer 22 including the contact plug 23. As the name indicates, the etch barrier layer 24 acts as a barrier against a dry etching process performed on the second insulation layer 25 and is formed by using nitride. The second insulation layer 25 is a basis for constructing the three-dimensional lower electrode and includes borophosphosilicate glass (BPSG), undoped silicate glass (USG), tetraethylorthosilicate (TEOS) or high density plasma (HDP).

Afterwards, the aforementioned dry etching process is performed sequentially on the second insulation layer 25 and the etch barrier layer 24, thereby forming the opening 26 exposing the contact plug 23. As for the formation of the opening 26, although not illustrated, a photosensitive layer is formed on the second insulation layer 25 and then, patterned to be a mask pattern, which is used as an etch barrier when the second insulation layer 25 and the etch barrier layer 24 are sequentially and selectively etched. If the height of the second insulation layer 25 is increased for the higher capacitance, a polysilicon-based hard mask can be employed to provide an ease proceeding of the dry etching process.

Figure 3B:
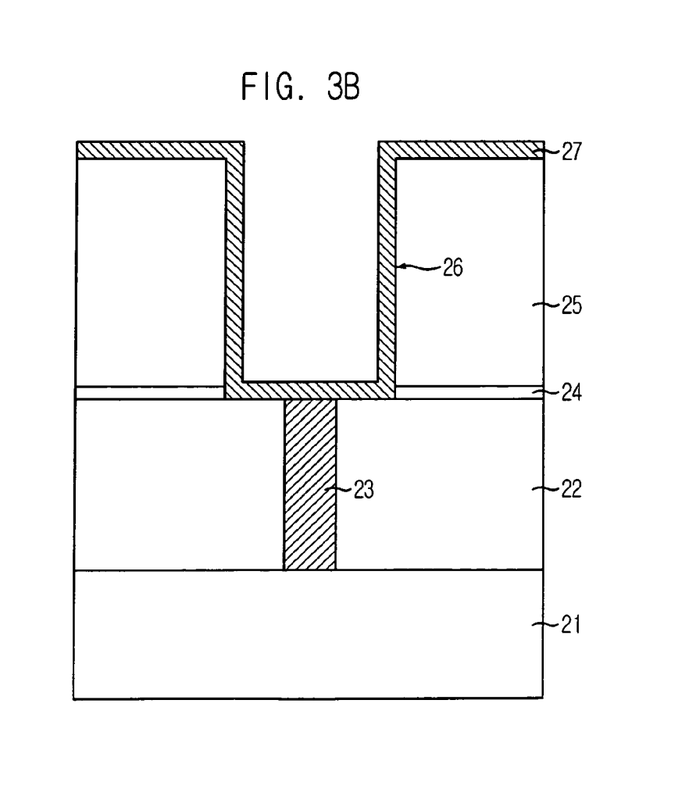

Referring to FIG. 3B, a conductive layer 27 is formed over the second insulation layer 25 along a profile of the opening 26. At this time, the conductive layer 27 is formed by using one of impurity doped polysilicon and impurity undoped polysilicon. In the case that the conductive layer 27 is based on the impurity doped polysilicon, phosphorus (P) or arsenic (As) is doped with a concentration of approximately $1 \times 10^{20}$ atoms/cm$^3$ to approximately $5 \times 10^{21}$ atoms/cm$^3$.

Also, in the case that the conductive layer 27 is based on either the impurity doped polysilicon or the impurity undoped polysilicon, phosphorus or arsenic can be additionally doped through a plasma process or a thermal process in an atmosphere of $AsH_3$ or $PH_3$. As a result of this additional doping, it is possible to improve a contact resistance characteristic between the contact plug 23 and the conductive layer 27.

Figure 3C:
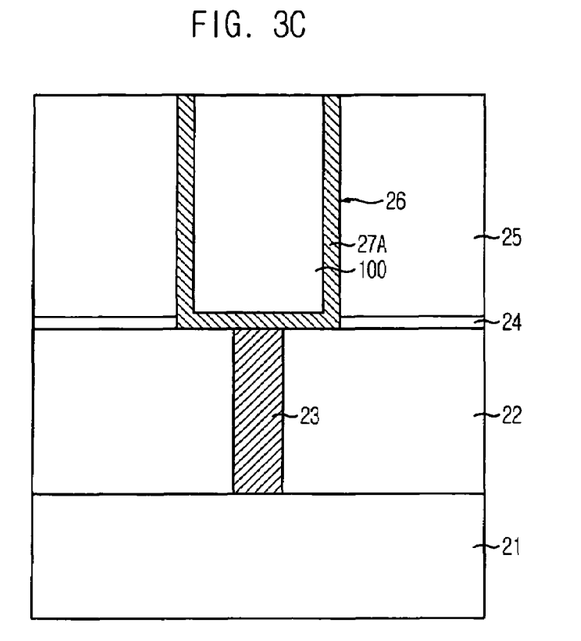

Referring to FIG. 3C, a lower electrode isolation process is performed on the conductive layer 27, thereby forming the patterned conductive layer 27A in the shape of a three-dimensional cylinder. In more detail of the lower electrode isolation process, a sacrificial protection layer 100 is formed on the conductive layer 27 until the sacrificial protection layer 100 fills the opening 26. The sacrificial protection layer 10 protects inner walls of the patterned conductive layer 27A formed inside the opening 26 during the lower electrode isolation process and can be either a photosensitive layer or an oxide layer based on undoped silicate glass (USG).

A portion of the sacrificial protection layer 100 disposed on the second insulation layer 25 outside the opening 26 is selectively removed, so that the sacrificial protection layer 100 remains inside the opening 26. As a result, except for the opening 26 overlaid with the sacrificial protection layer 100, portions of the conductive layer 27 formed on the second insulation layer 25 outside the opening 26 are exposed. Then, these exposed portions of the conductive layer 27 are subjected to the aforementioned etch-back process or CMP process to form the patterned conductive layer 27A in the three-dimensional cylinder structure.

As described above, during the lower electrode isolation process, there may be a chance that impurities including a polishing agent and etch remnants remain inside of the patterned conductive layer 27A when the etch-back process or CMP process is performed on the conductive layer 27. Thus, it is preferable to fill the opening 26 with the sacrificial protection layer 100 with a good step coverage characteristic.

Figure 3D:
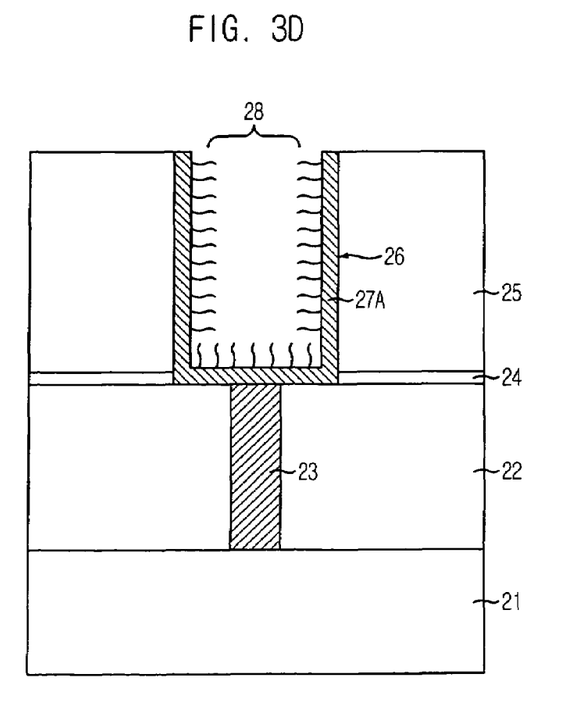

Referring to FIG. 3D, the sacrificial protection layer 100 remaining after the lower electrode isolation process is removed. At this time, if the sacrificial protection layer 100 is the photosensitive layer, oxygen plasma is used to remove the remaining sacrificial protection layer 100. If the sacrificial protection layer 100 is the oxide layer, a solution of buffered oxide etchant (BOE) or a solution of hydrogen fluoride (HF) is used to remove the remaining sacrificial protection layer 100.

Subsequently, the above substrate structure obtained after the remaining sacrificial protection layer 100 is removed is loaded into a reaction chamber for the chemical vapor deposition (CVD) method and is then subjected to a process for forming the nanotubes 28 in the shape of whiskers. For the process for forming the nanotubes 28, a typical mechanism for obtaining metastable polysilicon (MPS) is employed while those parameters including a flow amount of a source gas, a mixing ratio, a temperature and a pressure are adjusted to form the whisker type nanotubes 28 projecting from a surface of the patterned conductive layer 27A without using a catalytic layer.

Unlike the conventional nanotube formation process, which requires the catalytic layer, the nanotube formation process according to the preferred embodiment of the present invention does not require the catalytic layer because of the use of the MPS mechanism. That is, although the size and shape of the conventional nanotubes can be controlled through adjusting the reaction conditions, a metal seed layer used as the catalytic layer is essentially required to form the nanotubes. Hence, the nanotube formation process gets complicated and, the bottom layers disposed beneath the nanotubes are formed with certain restrictions. However, the use of the MPS mechanism makes it possible to grow the whisker type nanotubes without using the catalytic or metal seed layer.

For instance, if the nanotubes 28 according to the preferred embodiment of the present invention include silicon, the CVD method for forming the nanotubes 28 uses a source gas of $SiH_4$ or $CH_3SiCl_3$. If the nanotubes 28 include carbon, the CVD method uses a source gas selected from a group of carbon-based gases consisting of $C_2H_2$, $C_2H_4$, $CH_4$, and CO. If the nanotubes 28 include silicon and carbon, a source gas selected from a family of silicon gases such as $SiH_4$ or $CH_3SiCl_3$ and another source gas selected from a family of carbon gases such as $C_2H_2$, $C_2H_4$, $CH_4$, and CO are mixed with a predetermined ratio. Also, $H_2$ gas and He gas are used as a carrier gas and a dilution gas, respectively. In addition, the selected source gas is flowed for every minute in an amount ranging from approximately 15 sccm to approximately 30 sccm and, the CVD method is carried out at a temperature ranging from approximately 500° C. to approximately 1,200° C. and at a pressure ranging from approximately 4 torr to approximately 7 torr.

Figure 3E:
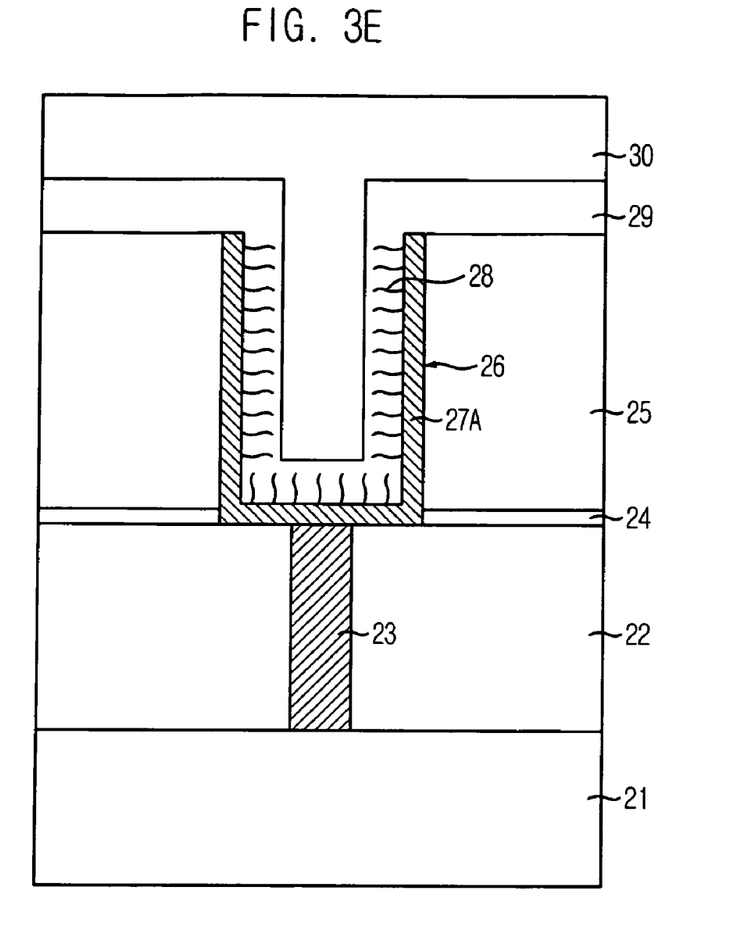

Referring to FIG. 3E, a dielectric layer 29 and an upper electrode 30 are sequentially formed on the patterned conductive layer 27A on which the nanotubes 28 are formed, thereby obtaining the cylinder type capacitor. The dielectric layer 29 is formed by using a material including one of oxide/nitride/oxide (ONO), $HfO_2$, $Al_2O_3$ and $Ta_2O_5$. The upper electrode 31 is based on a material selected from a group consisting of TiN, Ru, $RuO_2$, Al, Cu and Pt by employing one of a CVD method, an atomic layer deposition (ALD) method and a physical vapor deposition (PVD) method.

Figure 4A:
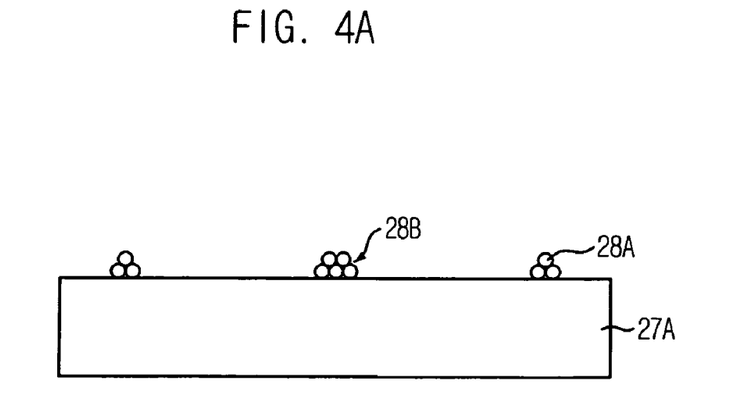
FIGS. 4A to 4C are diagrams showing a method for forming silicon nanotubes of a nanotube array in accordance with the preferred embodiment of the present invention.
Figure 4B:
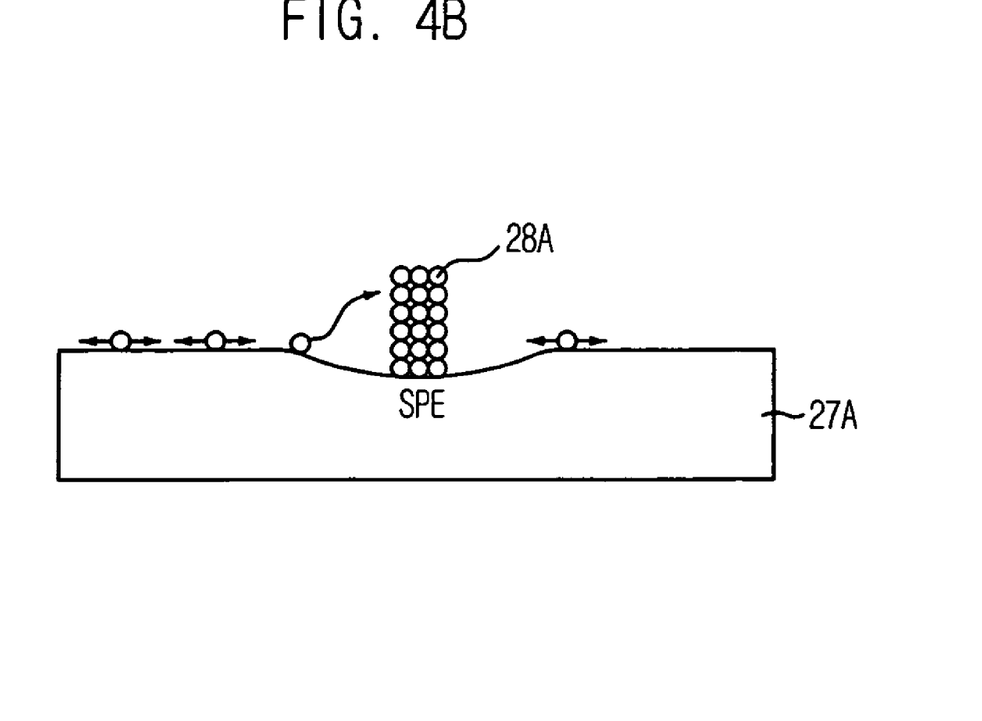
Figure 4C:
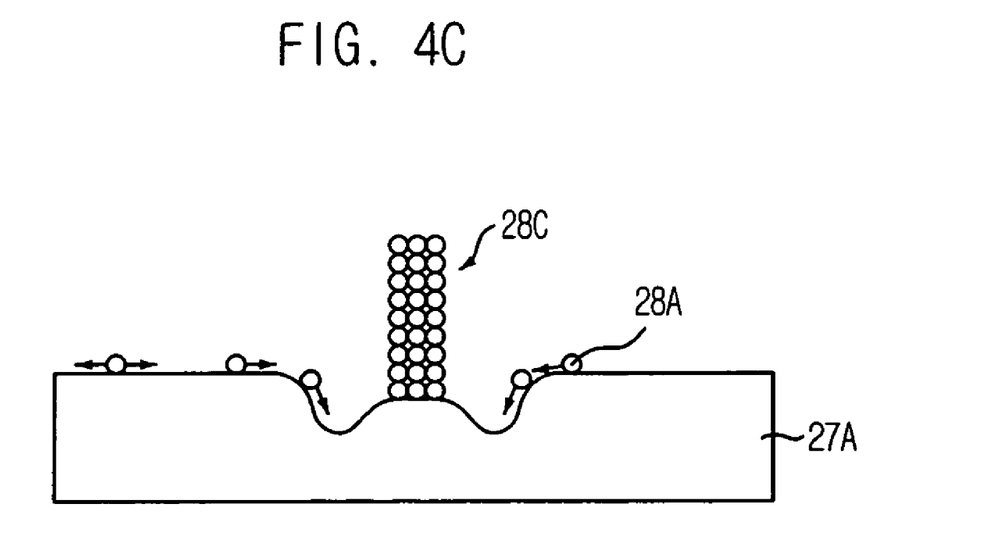

FIGS. 4A to 4C are detailed diagrams illustrating a method of forming silicon nanotubes in accordance with the preferred embodiment of the present invention. It should be noted that the same reference numerals are used for the same configuration elements used in the FIGS. 3A to 3E.

Referring to FIG. 4A, silicon nanotube nuclei 28B are formed on a patterned conductive layer 27A. For instance, $SiH_4$ gas is supplied to a reaction chamber along with $H_2$ gas and He gas used as a carrier gas and a dilution gas, respectively. Especially, when the $SiH_4$ gas hits a surface of the patterned conductive layer 27A, the silicon nanotube nuclei 28B including silicon atoms 28A are formed on the surface of the patterned conductive layer 27A.

Referring to FIG. 4B, when a thermal annealing process is carried out in a high vacuum state, a solid phase epitaxial (SPE) growth of silicon crystals is initiated from the silicon nanotube nuclei 28B which are sources for the growth. At this time, the thermal annealing process is performed at a temperature of approximately 600° C. and at a vacuum degree of approximately $10^{-4}$ pa. In such thermal annealing process, the silicon atoms move along the surface of the patterned conductive layer 27A doped with a predetermined impurity.

Referring to FIG. 4C, as the thermal annealing process proceeds, the silicon atoms 28A are gathered towards the silicon nanotube nuclei 28B, thereby forming a whisker type silicon nanotube 28C with the wide surface area. Especially, the formation of the silicon nanotube 28C in the shape of a whisker is realized by adjusting flow amounts and mixing ratios of the employed gases, temperature and pressure. It should be noted that the adjustment of these parameters are sufficient to form the whisker type silicon nanotube 28C even without using a catalytic layer.

Figure 5:
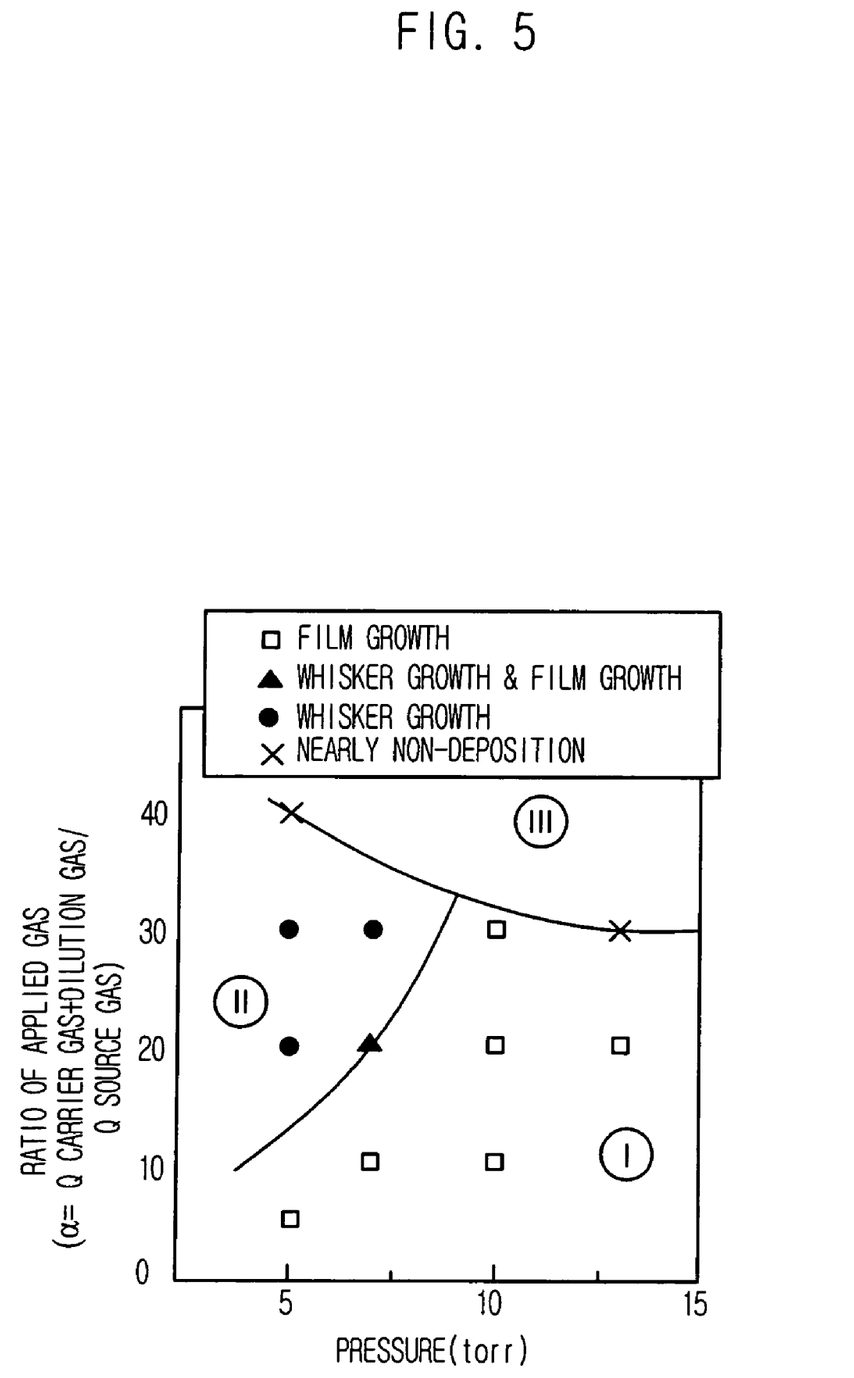
FIG. 5 is a graph showing growth conditions for forming nanotubes depending on a pressure without using a catalytic layer in accordance with the preferred embodiment of the present invention.

FIG. 5 is a graph showing growth conditions for forming nanotubes according to a parameter of pressure in the absence of a catalytic layer in accordance with the preferred embodiment of the present invention.

Especially, the horizontal axis and the vertical axis express the pressure and a ratio of an applied gas in percentage, that is, a ratio of a source gas with respect to a carrier gas and a dilution gas. More specifically, the ratio of the applied gas 'α' can be defined as follows.

$$\alpha = Q_{(carrier\ gas+dilution\ gas)} / Q_{source\ gas} \qquad \text{Eq. 1}$$

Herein, Q represents a quantity of each applied gas.

As shown in FIG. 5, those symbols 'x', '☐', '▲', and '●' represent a non-deposited state, a film growth, a whisker growth and a film growth, and a whisker growth, respectively. The whisker growth is observed when the pressure is within a range from approximately 4 torr to approximately 7 torr and the ratio of the applied gas is within a range from approximately 25% to approximately 35%. Also, a roman numeral I, II and III represent a region where a thin film is formed in a predetermined thickness, a region where a whisker type nanotube is formed and a region where a thin film is not deposited, respectively. These regions I, II and III can be formed by adjusting the growth conditions.

Therefore, instead of a bar type, the nanotube is grown in the form of a whisker to increase a surface area of a lower electrode. For the whisker growth of the nanotube, a temperature for the nanotube formation process is set within a range from approximately 500° C. to approximately 1,200° C., while a pressure is set within a range from approximately 4 torr to approximately 7 torr. Also, the ratio of the applied gas is set within a range from approximately 25% to approximately 35%.

Preferably, when approximately 15 sccm to approximately 30 sccm of the source gas is applied, the mixed amount of the carrier gas and the dilution gas has a minimum value of approximately 3.75 sccm and a maximum value of approximately 10.5 sccm in order for the ratio of the applied gas to be in the aforementioned range from approximately 25% to approximately 35%. For instance, if approximately 15 sccm of the source gas is used, the mixed amount of the carrier gas and the dilution gas should be range from approximately 3.75 sccm to approximately 5.25 sccm in order to achieve the range of the applied gas ratio at approximately 25% to approximately 35%. If approximately 30 sccm of the source gas is used, the mixed amount of the carrier gas and the dilution gas should range from approximately 7.5 sccm to approximately 10.5 sccm for the intended range of the applied gas ratio, that is, approximately 25% to approximately 35%.

As illustrated in FIG. 3D, the surface area of the lower electrode can be increased by forming the whisker type nanotubes 28 on the patterned conductive layer 27A. In general, when MPS is employed as the lower electrode material, the surface area of the lower electrode is increased by approximately 1.8-fold to approximately 2.3-fold compared with that of the planar lower electrode. In the case of employing the nanotubes 28 as described in the preferred embodiment, the surface area of the lower electrode is increased by approximately threefold to approximately fivefold, thereby resulting in an increase of the capacitance per unit cell.

Also, although the MPS needs to be formed on the impurity doped silicon layer, the nanotubes according to the preferred embodiment of the present invention can be formed even on the impurity undoped polysilicon layer.

That is, as for the MPS-based lower electrode, the movement of silicon atoms takes place only on the impurity doped silicon layer. However, the nanotubes according to the preferred embodiment of the present invention can be grown even on the polysilicon layer that is not doped with the impurity. Thus, the nanotubes can be formed on various types of conductive layer with regardless of the impurity doping state.

On the basis of the preferred embodiment of the present invention, the formation of the whisker type nanotubes with use of the MPS mechanism provides an advantage of increasing the surface area of the lower electrode. As a result, it is possible to secure a higher level of the capacitance.

The present application contains subject matter related to the Korean patent application No. KR 2005-0027337, filed in the Korean Patent Office on Mar. 31, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a capacitor, comprising the steps of:
   forming a conductive layer for forming a lower electrode;
   forming a nanotube array including a plurality of nanotubes formed on the conductive layer without using a catalytic layer;
   forming a dielectric layer on the nanotube array; and
   forming an upper electrode on the dielectric layer.

2. The method of claim 1, wherein the plurality of nanotubes are formed by employing a chemical vapor deposition method along with use of a carrier gas, a dilution gas and a source gas.

3. The method of claim 2, wherein the chemical vapor deposition method is carried out at a temperature of approximately 500° C. to approximately 1,200° C. and a pressure of approximately 4 torr to approximately 7 torr while a ratio of the source gas to a mixed gas of the carrier gas and the dilution gas is set to be in a range from approximately 25% to approximately 35%.

4. The method of claim 3, wherein the source gas is one of $SiH_4$ gas and $CH_3SiCl_3$ gas and the carrier gas and the dilution gas use $H_2$ gas and He gas, respectively.

5. The method of claim 4, wherein the source gas is flowed in an amount ranging from approximately 15 sccm to approximately 30 sccm for every minute.

6. The method of claim 3, wherein the source gas is selected from a group of carbon-based gases consisting of $C_2H_2$, $C_2H_4$, $CH_4$ and CO and the carrier gas and the dilution gas use $H_2$ gas and He gas, respectively.

7. The method of claim 6, wherein the source gas is flowed in an amount ranging from approximately 15 sccm to approximately 30 sccm for every minute.

8. The method of claim 3, wherein the source gas is a mixed gas of a silicon-based gas selected from $SiH_4$ and $CH_3SiCl_3$ and a carbon-based gas selected from a group consisting of $C_2H_2$, $C_2H_4$, $CH_4$ and CO and the carrier gas and the dilution gas use $H_2$ gas and He gas, respectively.

9. The method of claim 8, wherein the source gas is flowed in an amount ranging from approximately 15 sccm to approximately 30 sccm for every minute.

10. The method of claim 1, wherein the conductive layer is formed in one of an impurity doped silicon layer, an impurity undoped silicon layer and stacked layers thereof.

11. The method of claim 10, wherein the impurity doped silicon layer is doped with one impurity selected from phosphorus and arsenic.

12. The method of claim 11, wherein the impurity doped silicon layer has a doping concentration ranging from approximately $1\times10^{20}$ atoms/cm$^3$ to approximately $5\times10^{21}$ atoms/cm$^3$.

13. The method of claim 1, wherein the nanotubes are formed in the shape of whiskers.

* * * * *

UNITED STATES PATENT AND TRADEMARK OFFICE
CERTIFICATE OF CORRECTION

PATENT NO. : 7,463,476 B2　　　　　　　　　　　　　　　　　　　　　　　　　Page 1 of 1
APPLICATION NO. : 11/148057
DATED : December 9, 2008
INVENTOR(S) : Lee et al.

It is certified that error appears in the above-identified patent and that said Letters Patent is hereby corrected as shown below:

On the Title Page, Item (56)
In Item [56], under US Patent Documents, line 9 (2002/0160111 A1), please delete "10/2002" and insert -- 4/2002 --.

Signed and Sealed this

Fourteenth Day of April, 2009

JOHN DOLL
*Acting Director of the United States Patent and Trademark Office*

UNITED STATES PATENT AND TRADEMARK OFFICE
CERTIFICATE OF CORRECTION

PATENT NO.       : 7,463,476 B2                                              Page 1 of 1
APPLICATION NO.  : 11/148057
DATED            : December 9, 2008
INVENTOR(S)      : Lee et al.

It is certified that error appears in the above-identified patent and that said Letters Patent is hereby corrected as shown below:

On the Title Page, Item (56)
In Item [56], under US Patent Documents, line 9 (2002/0160111 A1), please delete "10/2002" and insert -- 4/2002 --.

Signed and Sealed this

Twenty-sixth Day of May, 2009

JOHN DOLL
*Acting Director of the United States Patent and Trademark Office*